(12) United States Patent
Hardee

(10) Patent No.: US 7,372,765 B2
(45) Date of Patent: May 13, 2008

(54) POWER-GATING SYSTEM AND METHOD FOR INTEGRATED CIRCUIT DEVICES

(75) Inventor: Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 26 days.

(21) Appl. No.: 11/198,031

(22) Filed: Aug. 5, 2005

(65) Prior Publication Data

US 2005/0270074 A1  Dec. 8, 2005

Related U.S. Application Data

(63) Continuation-in-part of application No. 10/776,101, filed on Feb. 11, 2004.

(60) Provisional application No. 60/500,126, filed on Sep. 4, 2003.

(51) Int. Cl.
*G11C 8/00* (2006.01)
(52) U.S. Cl. .................. 365/230.06; 365/226; 365/229
(58) Field of Classification Search ................ 365/226, 365/227, 20.06, 230.06; 327/333
See application file for complete search history.

(56) References Cited

U.S. PATENT DOCUMENTS

| 5,541,885 A | 7/1996 | Takashima |
|---|---|---|
| 5,814,851 A | 9/1998 | Suh |
| 6,049,245 A | 4/2000 | Son et al. |
| 6,072,333 A | 6/2000 | Tsukagoshi et al. |
| 6,100,563 A | 8/2000 | Arimoto |
| 6,208,171 B1 | 3/2001 | Kumagai et al. |

(Continued)

FOREIGN PATENT DOCUMENTS

JP    06-215658    3/1996

(Continued)

OTHER PUBLICATIONS

Min, Kyeong-Sik, Kawaguchi, Hiroshi, Sakurai, Takayasu, "ZigZag Super Cut-off CMOS (ZSCCMOS) Block Activation with Self-Adaptive Voltage Level Controller: An Alternative to Clock-Gating Scheme in Leakage Dominant Era", 2003 IEEE International Solid-State Circuits Conference, Feb. 12, 2003,Salon 1-6, pp. 400-401 and 501-502.

(Continued)

*Primary Examiner*—Huan Hoang
(74) *Attorney, Agent, or Firm*—William J. Kubida; Peter J. Meza; Hogan & Hartson LLP

(57) ABSTRACT

A power-gating system and method for integrated circuit devices wherein the minimization of "Standby" or "Sleep Mode" current is a design factor and wherein an output stage is coupled directly between a supply voltage level (VCC) and a reference voltage level (VSS). In a representative complementary metal oxide semiconductor (CMOS) implementation, the gate of the N-channel output transistor in the final inverter stage may be driven below VSS in Sleep Mode while, alternatively, the corresponding P-channel transistor can be driven above VCC. In Active Mode, the switching speed of the output stage is not impacted, and the preceding stage can be made smaller than that of the output stage.

56 Claims, 6 Drawing Sheets

U.S. PATENT DOCUMENTS

| | | |
|---|---|---|
| 6,208,575 B1 | 3/2001 | Proebsting |
| 6,275,432 B1 | 8/2001 | Hardee |
| 6,307,408 B1 | 10/2001 | Shamiou et al. |
| 6,424,585 B1 | 7/2002 | Ooishi |
| 6,449,182 B1 | 9/2002 | Ooishi |
| 6,449,204 B1 | 9/2002 | Arimoto et al. |
| 6,635,934 B2 * | 10/2003 | Hidaka ..................... 257/369 |
| 6,670,939 B2 | 12/2003 | Yang et al. |
| 6,795,328 B2 | 9/2004 | Kato et al. |

FOREIGN PATENT DOCUMENTS

| | | |
|---|---|---|
| JP | 08-098859 | 5/1997 |
| JP | 11-314744 | 4/2000 |
| JP | 2000-293986 | 10/2000 |
| JP | 2002-025267 | 1/2002 |
| JP | 2003-347431 | 12/2003 |

OTHER PUBLICATIONS

Hardee, K., Jones, F., Butler, D., Parris, M., Mound, M., Calendar, H., Jones, G., Aldrich, L., Gruenschlaeger, C., Miyabayashi, M., Taniguchi, K., Arakawa, T., "A0.6V 205MHz 19.5ns tRC 16Mb Embedded DRAM", 2004 IEEE International Solid-State Circuits Conference, Feb. 17, 2004, Salon 10-15, pp. 200-201.

* cited by examiner

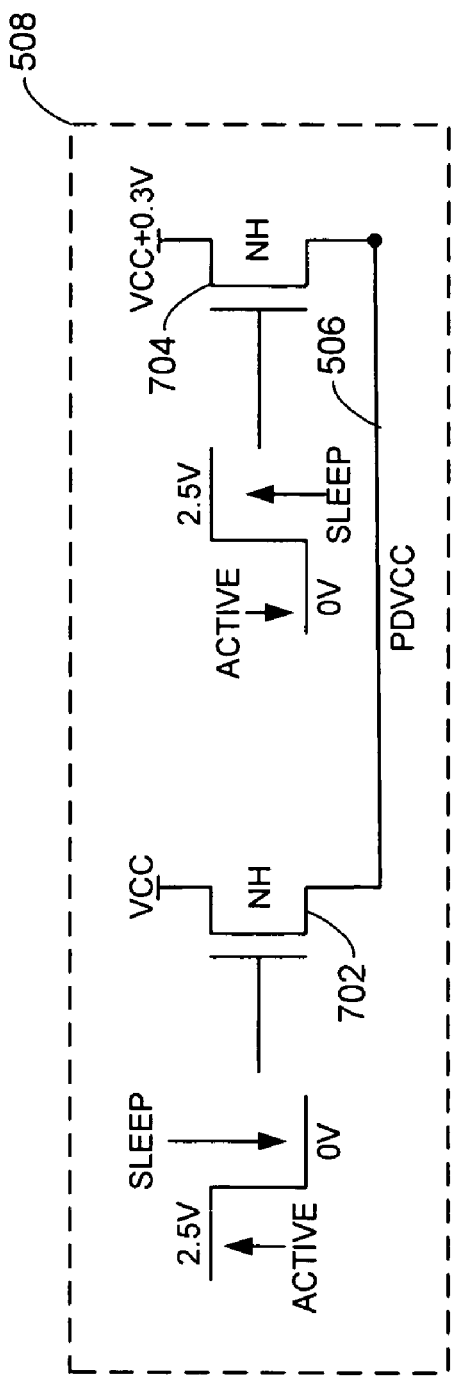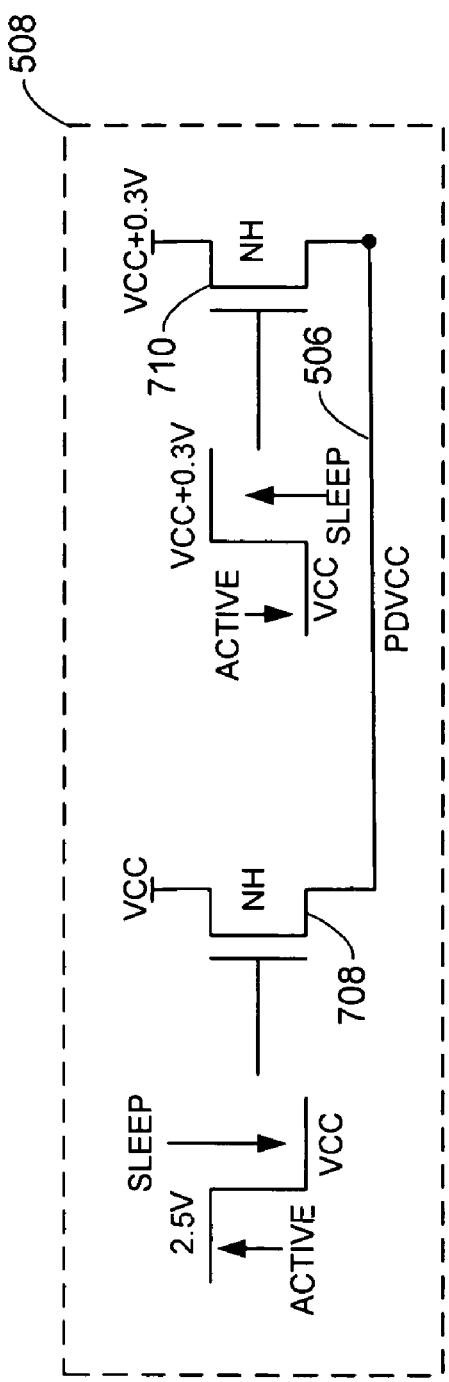

POWER-GATING SYSTEM AND METHOD FOR INTEGRATED CIRCUIT DEVICES

CROSS REFERENCE TO RELATED PATENT APPLICATIONS

The present invention claims priority from, and is a continuation-in-part application of, U.S. patent application Ser. No. 10/776,101 filed Feb. 11, 2004 for: "High Speed Power-Gating Technique for Integrated Circuit Devices Incorporating a Sleep Mode of Operation" which is related to, and claims priority from, U.S. Provisional Patent Application Ser. No. 60/500,126 filed Sep. 4, 2003 for "0.6V 205 MHz 19.5 nsec TRC 16 Mb Embedded DRAM". The disclosures of the foregoing applications are herein specifically incorporated by this reference in their entirety.

BACKGROUND OF THE INVENTION

The present invention relates, in general, to the field of integrated circuit (IC) devices. More particularly, the present invention relates to a power-gating system and method for integrated circuit devices wherein the minimization of "Standby" or "Sleep Mode" current is a design factor.

Power-gating has been used in conjunction with various circuits to reduce Sleep Mode power. Conventionally, this is achieved by adding transistors in the VCC and VSS supply paths to the circuit. These power gate transistors are turned "on" during an Active Mode of operation and turned "off" during Sleep Mode to reduce the total static current due to transistor "off" current. Typically, the gate terminals of the power gate transistors are forced to higher than VCC (in the case of P-channel devices) or lower than VSS (in the case of N-channel devices) voltage levels so that their voltage gate-to-source ($V_{GS}$) is negative. This reduces the "off" current of these transistors significantly.

However, since there are often a large number of circuits coupled to these power gate transistors, and all of these circuits may be switching at about the same time, the current surge through the power gate transistors during an Active Mode operation ends up being very large. This current surge causes a voltage drop across the power gate transistors which tends to have the same effect as reducing the level of VCC, thereby degrading performance. Furthermore, these power gate transistors must, of necessity, be made extremely large to avoid degrading circuit speed too much, (although such degradation nonetheless occurs to at least some extent) thereby consuming an excessive amount of on-chip area.

In write data driver circuits associated with integrated circuit memory arrays, this conventional approach is effective if the power-gate transistors can be shared by a significant number of circuits that do not switch at the same time. However, in the case of integrated circuit memory devices and those incorporating embedded memory where there are a large number of write data drivers (for example up to 256 or more) that switch at the same time, the current surge going through the power-gate transistors can be very large. This results in a voltage drop across the power-gate transistor which limits the switching speed of the output stage of the write data driver circuits.

SUMMARY OF THE INVENTION

Disclosed herein is a high speed power-gating technique for integrated circuit devices incorporating a Sleep Mode of operation wherein an output stage is coupled directly between VCC and VSS. Instead of connecting a power-gate transistor in series with the output stage as in prior art techniques, the gate of the N-channel output transistor in the final inverter stage is driven below VSS in Sleep Mode (alternatively, the corresponding P-channel transistor can be driven above VCC in Sleep Mode).

In operation, the overall effect is one which is similar to that of conventional power-gating techniques in that the "off" current through the N-channel device is significantly reduced because its gate-to-source voltage ($V_{GS}$) is negative. In Active Mode, however, the switching speed of the output stage is not impacted, and the preceding stage can be made smaller than that of the output stage (on the order of approximately one third to one fifth the size) and, therefore, the current surge through the power-gate transistors will be small compared to that experienced with respect to conventional power-gating approaches.

Particularly disclosed herein is an integrated circuit device including a source of a supply voltage level and a reference voltage level, the device comprising a power-gating transistor coupling the source of the supply voltage level to a power-gated voltage line, a reference voltage line having a Sleep Mode reference voltage level below that of the reference voltage level, at least one inverter stage coupled between the power-gated voltage line and the reference voltage line and an output inverter stage coupled to the output of the at least one inverter stage and coupled between the source of the supply voltage level and the reference voltage level.

Further disclosed herein is an integrated circuit device including a source of a supply voltage level and a reference voltage level, the device comprising a power-gating transistor coupling the reference voltage line to a power-gated reference line, a supply voltage line having a Sleep Mode reference voltage level above that of the supply voltage level, at least one inverter stage coupled between the power-gated reference line and the supply voltage line and an output inverter stage coupled to the output of the at least one inverter stage and coupled between the source of the supply voltage level and the reference voltage level.

Also further disclosed herein is a method for driving an output signal at the output of an inverter stage coupled between a source of a supply voltage level and a reference voltage line between a logic level "high" of substantially the supply voltage level and a logic level "low" of substantially zero volts comprising providing an input signal level to the inverter of less than zero volts to produce the logic level "high" at said output. Still further disclosed herein is a method for driving an output signal at the output of an inverter stage coupled between a source of a supply voltage level and a reference voltage line between a logic level "high" of substantially the supply voltage level and a logic level "low" of substantially zero volts comprising providing an input signal level to the inverter of greater than the supply voltage level to produce the logic level "low" at the output.

Additionally disclosed herein is an integrated circuit device including a driver circuit coupled to a source of a supply voltage level and a reference voltage level, the driver circuit comprising a power-gating transistor coupled between the source of said supply voltage level and a power-gated voltage line, a reference line having Active and Sleep states thereof and a plurality of series coupled inverter stages, odd ones of the plurality of inverter stages being coupled between the power-gated voltage line and the reference line and even ones of the plurality of inverter stages being coupled between the source of the supply voltage level and the reference voltage level.

Still further additionally disclosed is an integrated circuit device including a driver circuit coupled to a source of a supply voltage level and a reference voltage level, the driver circuit comprising a power-gating transistor coupled between the source of the reference voltage level and a power-gated reference line, a supply voltage line having Active and Sleep states thereof and a plurality of series coupled inverter stages, odd ones of the plurality of inverter stages being coupled between the supply voltage line and the power-gated reference line and even ones of the plurality of inverter stages being coupled between the source of the supply voltage level and the reference voltage level.

Further disclosed herein is an integrated circuit device including a driver circuit coupled to a source of a supply voltage level and a reference voltage level, the driver circuit comprising a first power-gating transistor coupled between the source of the supply voltage level and a power-gated voltage line, a second power-gating transistor coupled between the source of the reference voltage level and a power-gated reference line and a plurality of series coupled inverter stages, odd ones of the plurality of inverter stages being coupled between the power-gated voltage line and the reference voltage level and even ones of the plurality of inverter stages being coupled between the source of the supply voltage level and the power-gated reference line.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 6A and 6B are further alternative circuits for switching voltage on the PDVCC bus of FIG. 4.

DESCRIPTION OF A REPRESENTATIVE EMBODIMENT

Figure 1:
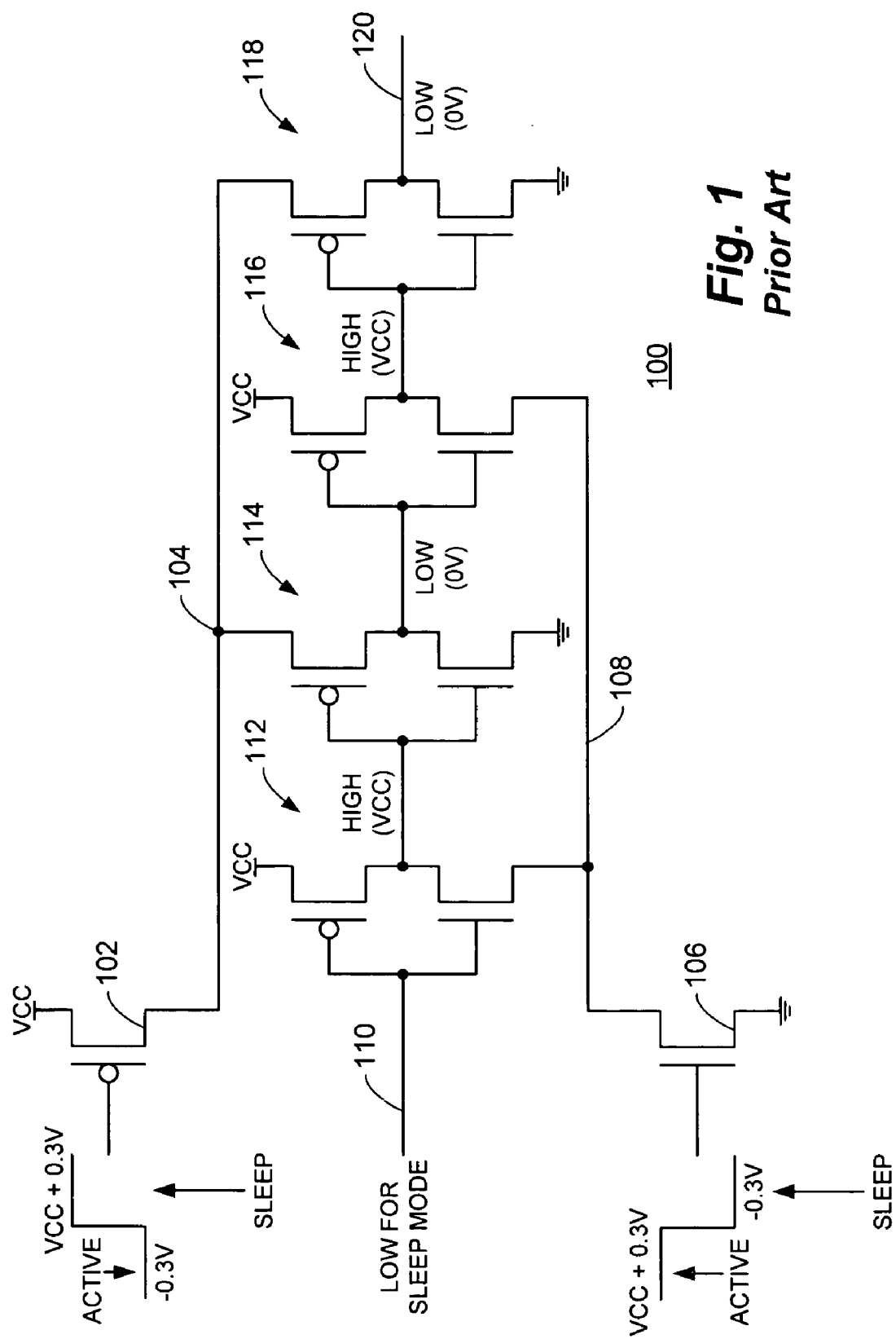
FIG. 1 is a representative circuit design in the form of a write data driver for an integrated circuit memory employing a conventional power-gating technique wherein the output stage is coupled to a power-gated supply voltage line.

With reference now to FIG. 1, a schematic illustration of a conventional power-gating technique employed in a write data driver power-gating circuit 100 is shown for use in an integrated circuit memory device or other device incorporating embedded memory.

The circuit 100 comprises a P-channel transistor 102 having its source coupled to a supply voltage VCC and its drain coupled to a power-gated supply voltage line 104. A voltage of −0.3V is applied to the gate terminal of the transistor 102 during an Active Mode of operation and a level of VCC+0.3V during a Sleep Mode. Similarly, an N-channel transistor 106 has its source coupled to a reference voltage (VSS) of circuit ground and its drain terminal coupled to a correspondingly power-gated reference voltage line 108 as shown. A voltage of VCC+0.3V is applied to the gate terminal of the transistor 106 during an Active Mode of operation and a level of −0.3V during a Sleep Mode.

An input signal on line 110, which is at a logic level "low" during the Sleep Mode, is applied to the input of a first complementary metal oxide semiconductor (CMOS) inverter 112 which is coupled between VCC and the power-gated reference voltage line 108. Output from the inverter 112 is then applied to the input of a subsequent inverter 114 which is coupled between the power-gated supply voltage line 104 and circuit ground. In like manner, the output of the inverter 114 is coupled to the input of a third inverter 116 which is also coupled between VCC and the power-gated reference voltage line 108. The output from the inverter 116 is then coupled to the input of a fourth inverter 118 coupled between the power-gated supply voltage line 104 and circuit ground. Output of the circuit 100 is taken on line 120.

As can be seen, the signal level between inverters 112 and 114, as well as between inverters 116 and 118, is at a logic level "high" of VCC in Sleep Mode while the signal level between inverters 114 and 116, as well as on the output line 120, is at a logic level "low" of 0V.

As illustrated, conventional power-gating techniques can be applied to reduce Sleep Mode power in integrated circuit devices. In accordance with the conventional method shown and described, large power-gating transistors 102 and 108 are added between the power-gated circuitry (in this case, a write data driver comprising inverters 112 through 118 inclusive) and the supply voltage source (VCC) and the reference voltage level (VSS or circuit ground). This approach is effective if the power-gate transistors 102, 106 can be shared by a large number of circuits that do not switch at the same time. However, in the case where there are a large number of circuits that switch at the same time, a better power-gating solution is needed.

In those cases wherein the inverters 112 through 118 may be repeated many times on a single integrated circuit device, (e.g. 256 times or more) and the output inverters 118 all switch at the same time, then the current surge going through the power-gate transistor 102 would be very large. This would result in an effective voltage drop across the power-gate transistor 102 which would limit the switching speed of the output stage. Therefore, the power-gate transistor 102 would have to be made very large and the switching speed of the circuit 100 would still be degraded.

Figure 2:
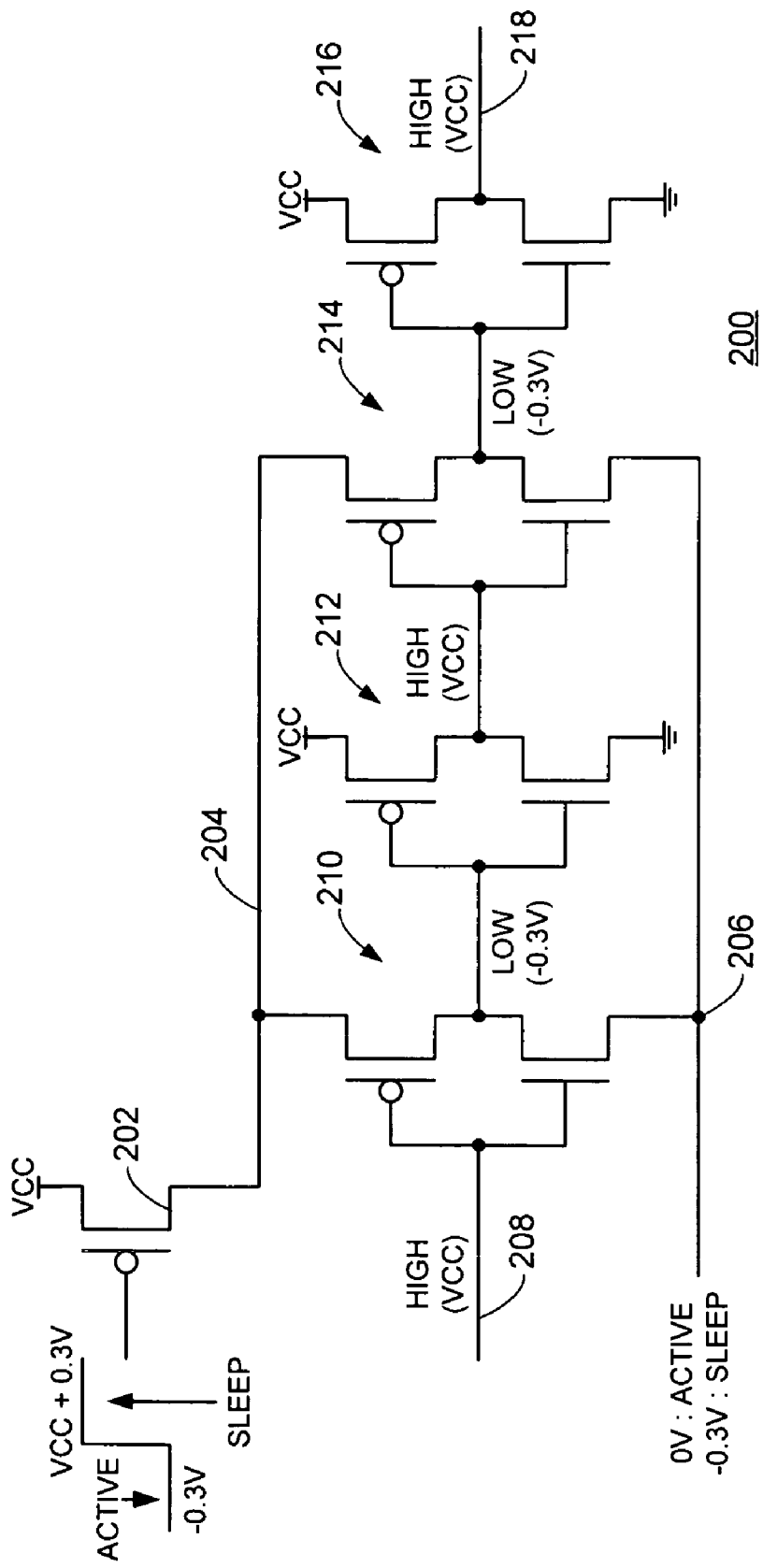
FIG. 2 is an exemplary IC circuit design implementing the power-gating system and method of the present invention wherein the intermediate nodes are driven to a level below VSS thereby obviating the need to power-gate each stage of the circuit.

With reference additionally now to FIG. 2, an exemplary IC circuit 200 design is shown implementing the power-gating system and method of the present invention. As will be more fully described hereinafter, the intermediate nodes of the circuit 200 are driven to a level below VSS thereby obviating the need to power-gate each stage.

The circuit 200, in pertinent part, comprises a P-channel power-gate transistor 202 with its source coupled to VCC and which receives an Active Mode signal of −0.3V (the voltage may be substantially in the range of −0.2V to −0.3V)

and a Sleep Mode signal of VCC+0.3V (the voltage may be substantially in the range of VCC+0.2V to VCC+0.3V) at its gate terminal. The drain terminal of transistor 202 is coupled to a power-gated supply voltage line 204. A corresponding reference voltage line 206 is at a level of 0V in an Active Mode of operation and a level of –0.3V is a Sleep Mode.

A first inverter 210 is coupled between the power-gated supply voltage line 204 and the reference voltage line 206 and receives a logic level "high" signal on its input line 208. Output of the inverter 210 is coupled to the input of another inverter 212 coupled between VCC and circuit ground. When the signal on line 208 is at a level of VCC, the input to the inverter 212 is at a logic "low" level of –0.3V. In turn, the output of the inverter 212 is coupled to the input of a third inverter 214 which is also coupled between the power-gated supply voltage line 204 and the reference voltage line 206 and receives a logic level "high" signal at its input. Similarly, the output of the inverter 214, which is at a logic level "low" of –0.3V is coupled to the input of a fourth inverter 216 which is coupled between VCC and circuit ground. The output of the inverter 216 on line 218 is then a logic level "high" of VCC.

Figure 3:
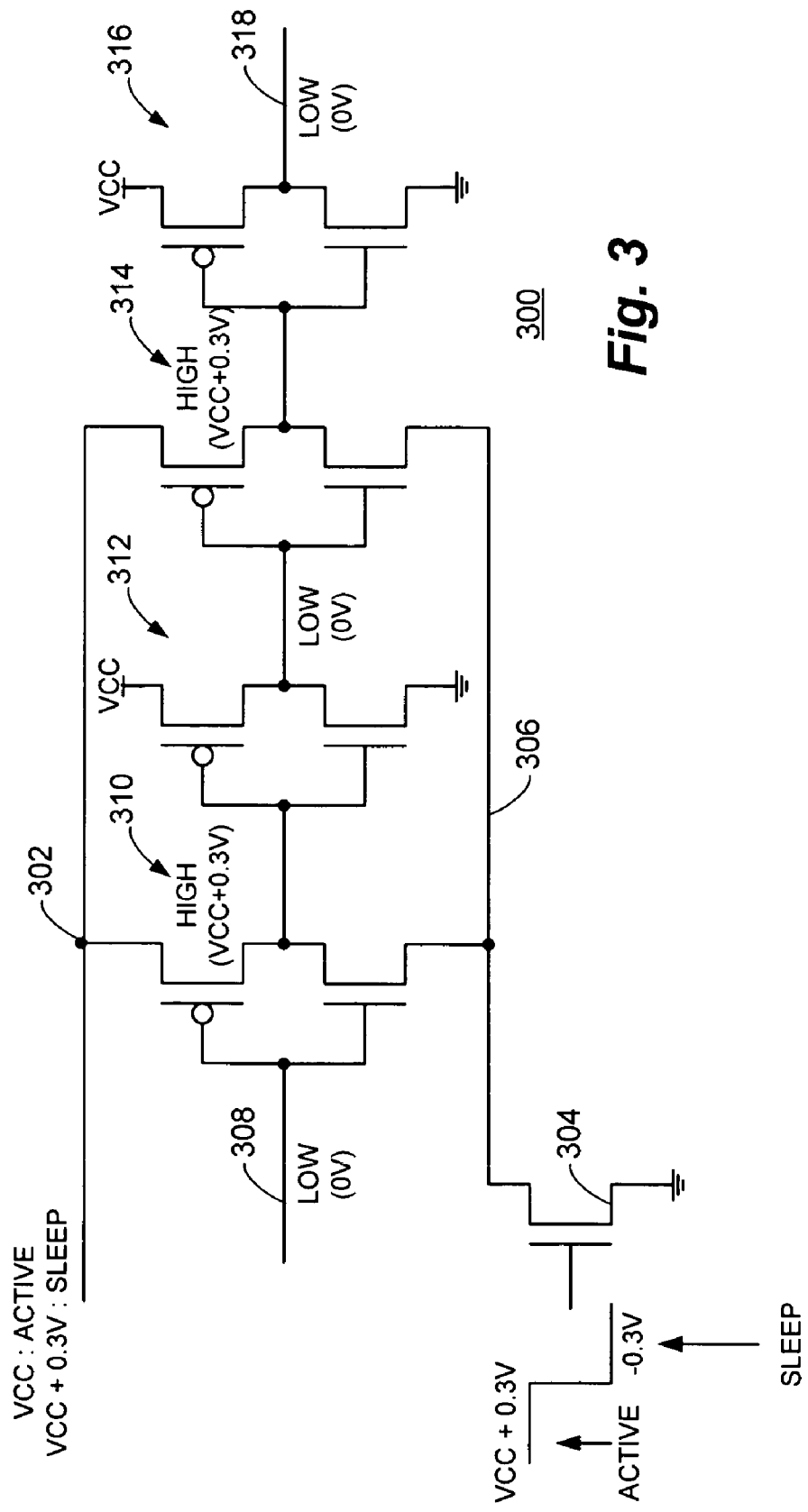
FIG. 3 is a further exemplary IC circuit design implementing the power-gating system and method of the present invention wherein the intermediate nodes are driven to a level above VCC thereby obviating the need to power-gate each stage of the circuit.

With reference additionally now to FIG. 3, a further exemplary IC circuit 300 design is shown implementing the power-gating system and method of the present invention. In the embodiment of circuit 300, the intermediate nodes are driven to a level above VCC thereby obviating the need to power-gate each stage of the circuit 300.

The circuit 300, in pertinent part, comprises an N-channel power-gate transistor 304 with its source coupled to VSS (or circuit ground) and which receives an Active Mode signal of VCC+0.3V and a Sleep Mode signal of –0.3V at its gate terminal. The drain terminal of transistor 304 is coupled to a power-gated reference voltage line 306. A corresponding supply voltage line 302 is at a level of VCC in an Active Mode of operation and a level of VCC+0.3V is a Sleep Mode.

A first inverter 310 is coupled between the supply voltage line 302 and the power-gated reference voltage line 306 and receives a logic level "low" signal of 0V on its input line 308. Output of the inverter 310 is coupled to the input of another inverter 312 coupled between VCC and circuit ground. When the signal on line 308 is at a level of 0V, the input to the inverter 312 is at a logic "high" level of VCC+0.3V. In turn, the output of the inverter 312 is coupled to the input of a third inverter 314 which is also coupled between the supply voltage line 302 and the power-gated reference voltage line 306 and receives a logic level "low" signal at its input. Similarly, the output of the inverter 314, which is at a logic level "high" of VCC+0.3V is coupled to the input of a fourth inverter 316 which is coupled between VCC and circuit ground. The output of the inverter 316 on line 318 is then a logic level "low" of 0V.

Figure 4:
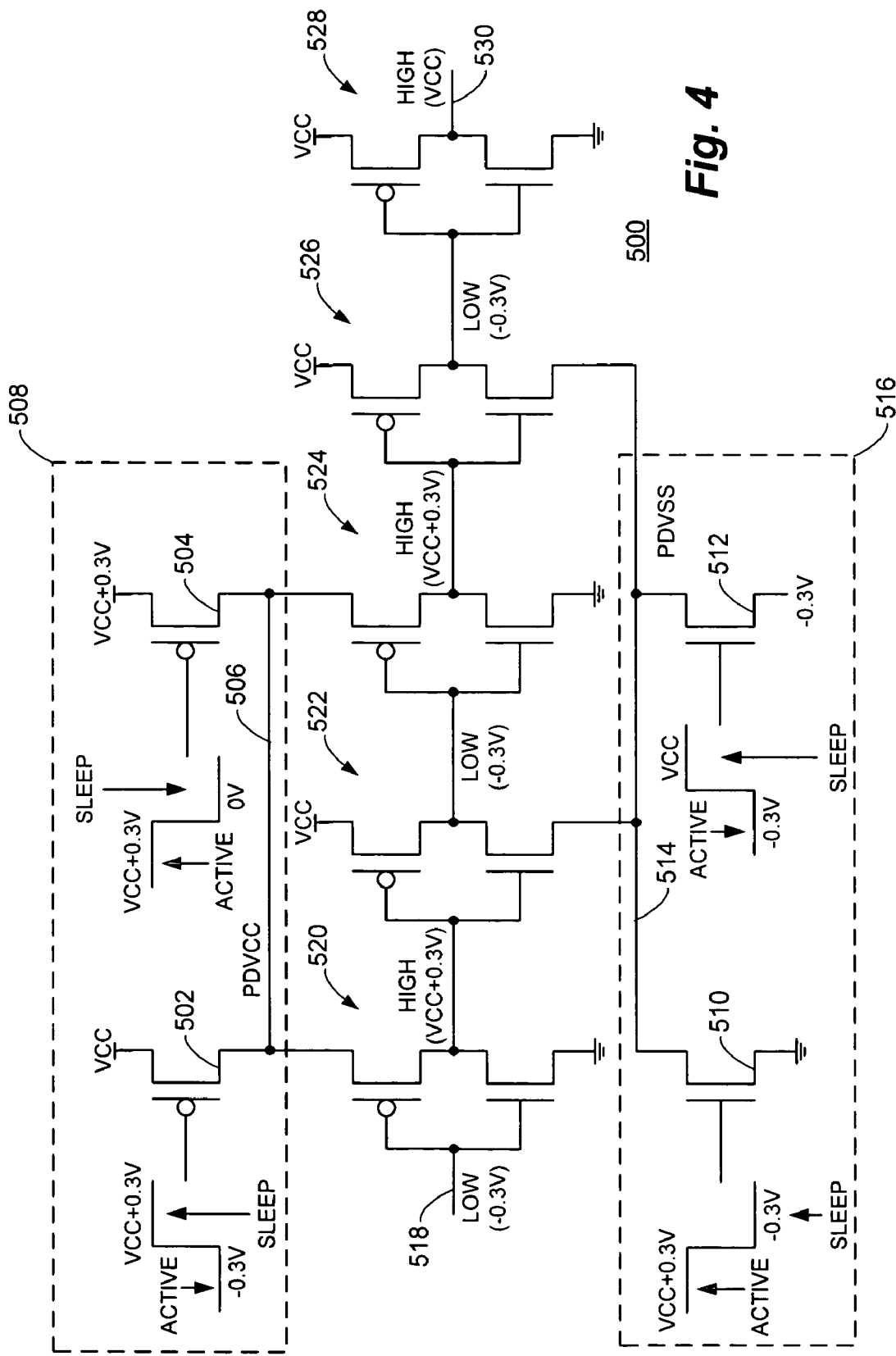
FIG. 4 is a further exemplary IC circuit design implementing the power-gating system and method of the present invention which comprises a variation on the circuit of the preceding figure.

With reference additionally now to FIG. 4, a further exemplary IC circuit 500 design is shown implementing the power-gating system and method of the present invention which comprises a variation on the circuit 400 of the preceding figure.

The circuit 500 comprises, in pertinent part, a P-channel transistor 502 having its source coupled to VCC and its gate terminal coupled to receive a signal of –0.3V in an Active Mode and VCC+0.3V in Sleep Mode. The drain terminal of transistor 502 is coupled to a power-gated supply voltage line 506 (PDVCC). An additional P-channel transistor 504 has its source coupled to a level of VCC+0.3V and its gate terminal coupled to receive a signal of VCC+0.3V in an Active Mode and 0V in Sleep Mode. The drain terminal of transistor 504 is also coupled to the power-gated supply voltage line 506. Transistors 502 and 504 together comprise a power-gated supply voltage circuit 508. A first inverter 520 is coupled between the power-gated supply voltage line 506 and circuit ground and receives a logic level "low" signal of –0.3V at its input on line 518.

In like manner, an N-channel transistor 510 has its source coupled to circuit ground (VSS) and its gate terminal coupled to receive a signal of VCC+0.3V in an Active Mode and –0.3V in Sleep Mode. The drain terminal of transistor 510 is coupled to a power-gated reference voltage line 514 (PDVSS). An additional N-channel transistor 512 has its source coupled to a level of –0.3V and its gate terminal coupled to receive a signal of –0.3V in an Active Mode and VCC in Sleep Mode. The drain terminal of transistor 510 is also coupled to the power-gated reference voltage line 514. Transistors 510 and 512 together comprise a power-gated reference voltage circuit 516. A second inverter 522 is coupled between VCC and the power-gated reference voltage line 514 and receives a logic level "high" signal of VCC+0.3V at its input from the output of the first inverter 520. A third inverter, 524 is coupled to the output of the inverter 522 and is coupled between the power-gated supply voltage line 506 and circuit ground and receives a logic level "low" signal of –0.3V at its input from the output of inverter 522. Similarly, a fourth inverter 526 is coupled between VCC and the power-gated reference voltage line 514 and receives a logic level "high" signal of VCC+0.3V at its input from the output of the third inverter 524. A fifth inverter 528 is coupled between VCC and circuit ground and receives a logic level "low" signal of –0.3V at its input to produce a logic level "high" signal of VCC at its output on line 530.

Figure 5A:
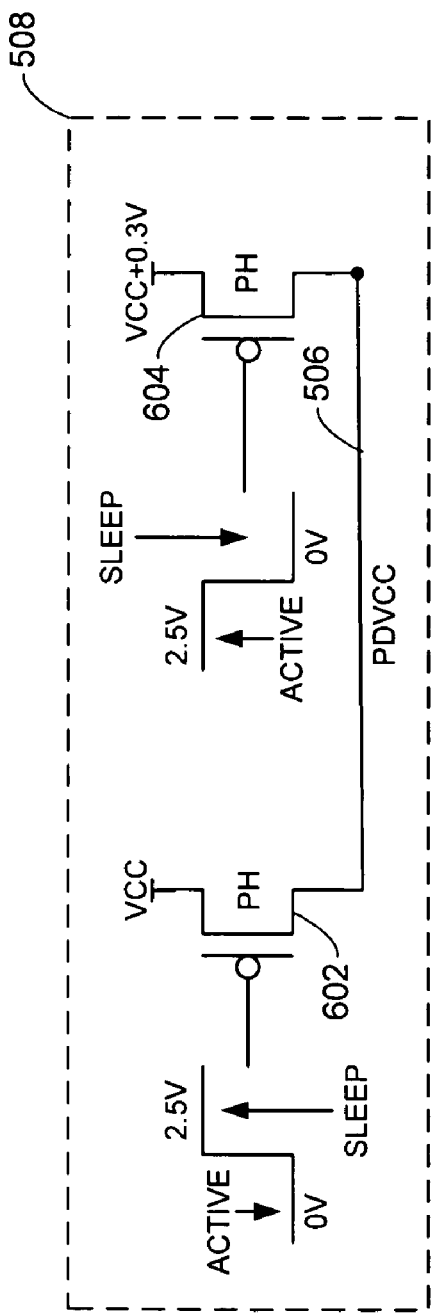
FIGS. 5A and 5B are, respectively, alternative circuit designs for providing a power-gated supply voltage (PDVCC) and power-gated reference voltage (PDVSS) on the buses illustrated in the preceding figure using high voltage transistors.
Figure 5B:
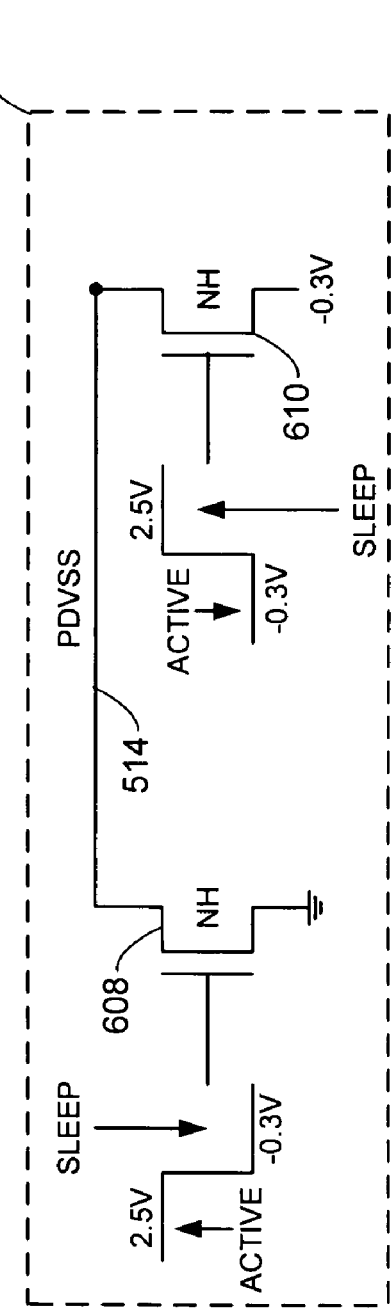

With reference additionally now to FIGS. 5A and 5B, alternative circuit 600 and 606 designs are shown for respectively providing a power-gated supply voltage circuit 508 and a power-gated reference voltage circuit 516 using high voltage transistors.

Referring specifically to the former figure, a first high voltage P-channel transistor 602 has its source terminal coupled to VCC and its drain terminal coupled to PDVCC line 506. Similarly, a second high voltage P-channel transistor 604 has its source terminal coupled to VCC+0.3V and its drain terminal coupled to line 506. An Active Mode signal of 0V is applied to the gate of transistor 602 and 2.5V to the gate of transistor 604. In a Sleep Mode of operation, 2.5V is applied to the gate terminal of transistor 602 while 0V is applied to the gate of transistor 604.

With reference to the latter figure, a first high voltage P-channel transistor 608 has its source terminal coupled to circuit ground and its drain terminal coupled to PDVSS line 514. Similarly, a second high voltage P-channel transistor 610 has its source terminal coupled to –0.3V and its drain terminal coupled to line 514. An Active Mode signal of 2.5V is applied to the gate of transistor 608 and –0.3V to the gate of transistor 610. In a Sleep Mode of operation, –0.3V is applied to the gate terminal of transistor 608 while 2.5V is applied to the gate of transistor 610.

With reference additionally now to FIGS. 6A and 6B, further alternative circuits 700 and 706 are shown for providing a power-gated supply voltage circuit 508 and switching voltage on the PDVCC bus 506 of FIG. 4.

Referring specifically to the former figure, a first high voltage N-channel transistor 702 has one terminal coupled to VCC and another terminal coupled to PDVCC line 506. Similarly, a second high voltage N-channel transistor 704 has one terminal coupled to VCC+0.3V and another terminal coupled to line 506. An Active Mode signal of 2.5V is applied to the gate of transistor 702 and 0V to the gate of transistor 704. In a Sleep Mode of operation, 0V is applied to the gate terminal of transistor 702 while 2.5V is applied to the gate of transistor 704.

With reference to the latter figure, a first high voltage N-channel transistor 708 has one terminal coupled to VCC and another terminal coupled to PDVCC line 506. Similarly, a second high voltage N-channel transistor 710 has one terminal coupled to VCC+0.3V and another terminal coupled to line 506. An Active Mode signal of 2.5V is applied to the gate of transistor 708 and VCC to the gate of transistor 710. In a Sleep Mode of operation, VCC is applied to the gate terminal of transistor 708 while VCC+0.3V is applied to the gate of transistor 710.

While there have been described above the principles of the present invention in conjunction with specific circuits implementing the system and method of the present invention, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. An integrated circuit device including a source of a substantially constant supply voltage and a substantially constant reference voltage, said device comprising:
   a power-gating transistor coupling said source of said substantially constant supply voltage to a first switched voltage line;
   a second switched voltage line having a Sleep Mode voltage below that of said substantially constant reference voltage;
   at least one inverter stage coupled between said first switched voltage line and said second switched voltage line; and
   an output inverter stage coupled to the output of said at least one inverter stage and coupled between said source of said substantially constant supply voltage and said substantially constant reference voltage.

2. The integrated circuit device of claim 1 wherein said power-gating transistor comprises a P-channel transistor having a gate terminal thereof for receiving a Sleep Mode voltage above that of said substantially constant supply voltage.

3. The integrated circuit device of claim 2 wherein said second switched voltage line has an Active Mode voltage substantially equal to said substantially constant reference voltage.

4. The integrated circuit device of claim 2 wherein said gate terminal of said P-channel transistor receives an Active Mode voltage below that of said substantially constant reference voltage.

5. The integrated circuit device of claim 1 further comprising at least one additional inverter stage coupled between said source of said substantially constant supply voltage and said substantially constant reference voltage for driving said at least one inverter stage.

6. The integrated circuit device of claim 1 wherein said power-gating transistor is turned off in the Sleep Mode.

7. The integrated circuit device of claim 1 wherein said power-gating transistor is turned on in an Active Mode.

8. An integrated circuit device including a source of a substantially constant supply voltage and a substantially constant reference voltage, said device comprising:
   a power-gating transistor coupling said substantially constant reference voltage to a first switched voltage line;
   a second switched voltage line having a Sleep Mode voltage above that of said substantially constant supply voltage;
   at least one inverter stage coupled between said first switched voltage line and said second switched voltage line; and
   an output inverter stage coupled to the output of said at least one inverter stage and coupled between said source of said substantially constant supply voltage and said substantially constant reference voltage.

9. The integrated circuit device of claim 8 wherein said power-gating transistor comprises an N-channel transistor having a gate terminal thereof for receiving a Sleep Mode voltage below that of said substantially constant reference voltage.

10. The integrated circuit device of claim 9 wherein said second switched voltage line has an Active Mode voltage substantially equal to said substantially constant supply voltage.

11. The integrated circuit device of claim 9 wherein said gate terminal of said N-channel transistor receives an Active Mode voltage above that of said substantially constant supply voltage.

12. The integrated circuit device of claim 8 further comprising at least one additional inverter stage coupled between said source of said substantially constant supply voltage and said substantially constant reference voltage for driving said at least one inverter stage.

13. The integrated circuit device of claim 8 wherein said power-gating transistor is turned off in the Sleep Mode.

14. The integrated circuit device of claim 8 wherein said power-gating transistor is turned on in an Active Mode.

15. An integrated circuit device including a driver circuit coupled to a source of a substantially constant supply voltage and a substantially constant reference voltage, said driver circuit comprising:
- a power-gating transistor coupled between said source of said substantially constant supply voltage and a first switched voltage line;
- a second switched voltage line having Active and Sleep states thereof; and
- a plurality of series coupled inverter stages, odd ones of said plurality of inverter stages being coupled between said first and second switched voltage lines and even ones of said plurality of inverter stages being coupled between said source of said substantially constant supply voltage and said substantially constant reference voltage.

16. The integrated circuit device of claim 15 wherein said power-gating transistor comprises a P-channel device.

17. The integrated circuit device of claim 15 wherein a gate terminal of said power-gating transistor receives an input voltage of less than said substantially constant reference voltage when said second switched voltage line is in said Active state thereof.

18. The integrated circuit device of claim 15 wherein a gate terminal of said power-gating transistor receives an input voltage of greater than said substantially constant supply voltage when said second switched voltage line is in said Sleep state thereof.

19. The integrated circuit device of claim 15 wherein said plurality of series coupled inverter stages comprise CMOS inverters.

20. The integrated circuit device of claim 15 wherein said power-gating transistor is turned off in the Sleep Mode.

21. The integrated circuit device of claim 15 wherein said power-gating transistor is turned on in the Active Mode.

22. An integrated circuit device including a driver circuit coupled to a source of a substantially constant supply voltage and a substantially constant reference voltage, said driver circuit comprising:
- a power-gating transistor coupled between said source of said substantially constant reference voltage and a first switched voltage line;
- a second switched voltage line having Active and Sleep states thereof; and
- a plurality of series coupled inverter stages, odd ones of said plurality of inverter stages being coupled between said first and second switched voltage lines and even ones of said plurality of inverter stages being coupled between said source of said substantially constant supply voltage and said substantially constant reference voltage.

23. The integrated circuit device of claim 22 wherein said power-gating transistor comprises an N-channel device.

24. The integrated circuit device of claim 22 wherein a gate terminal of said power-gating transistor receives an input voltage of greater than said substantially constant supply voltage when said second switched voltage line is in said Active state thereof.

25. The integrated circuit device of claim 22 wherein a gate terminal of said power-gating transistor receives an input voltage of less than said reference voltage when said second switched voltage line is in said Sleep state thereof.

26. The integrated circuit device of claim 22 wherein said plurality of series coupled inverter stages comprise CMOS inverters.

27. The integrated circuit device of claim 22 wherein said power-gating transistor is turned off in the Sleep Mode.

28. The integrated circuit device of claim 22 wherein said power-gating transistor is turned on in the Active Mode.

29. An integrated circuit device including a driver circuit coupled to a source of a substantially constant supply voltage and a substantially constant reference voltage, said driver circuit comprising:
- a first power-gating transistor coupled between said source of said substantially constant supply voltage and a first switched voltage line;
- a second power-gating transistor coupled between said source of said substantially constant reference voltage and a second switched voltage line; and
- a plurality of series coupled inverter stages, odd ones of said plurality of inverter stages being coupled between said first switched voltage line and said substantially constant reference voltage and even ones of said plurality of inverter stages being coupled between said source of said substantially constant supply voltage and said second switched voltage line,
- wherein said first switched voltage line is at a voltage greater than said substantially constant supply voltage and said second switched voltage line is at a voltage lower than said substantially constant reference voltage in a Sleep state thereof.

30. The integrated circuit device of claim 29 wherein said first switched voltage line is at substantially said substantially constant supply voltage and said second switched voltage line is at substantially said substantially constant reference voltage in an Active state thereof.

31. The integrated circuit device of claim 29 wherein said plurality of series coupled inverter stages comprise CMOS inverters.

32. The integrated circuit device of claim 29 wherein said first power-gating transistor comprises a P-channel device and said second power-gating transistor comprises an N-channel device.

33. The integrated circuit device of claim 29 further comprising an additional power-gating transistor coupled between a source of greater than said substantially constant supply voltage and said first switched voltage line.

34. The integrated circuit device of claim 33 further comprising another power-gating transistor coupled between a source of less than said substantially constant reference voltage and said second switched voltage line.

35. The integrated circuit device of claim 34 wherein said additional power-gating transistor comprises a P-channel device and said another power-gating transistor comprises an N-channel device.

36. The integrated circuit device of claim 34 wherein in an Active state thereof, a gate terminal of said first power-gating transistor is at a voltage less than said substantially constant reference voltage, a gate terminal of said second power-gating transistor is at a voltage greater than said substantially constant supply voltage, a gate terminal of said additional power-gating transistor is at a level greater than said substantially constant supply voltage and a gate terminal of said another power-gating transistor is at a level less than said substantially constant reference voltage.

37. The integrated circuit device of claim 34 wherein in a Sleep state thereof, a gate terminal of said first power-gating transistor is at a voltage greater than said substantially constant supply voltage, a gate terminal of said second power-gating transistor is at a voltage less than said substantially constant reference voltage, a gate terminal of said additional power-gating transistor is at a level of substantially said substantially constant reference voltage and a gate terminal of said another power-gating transistor is at a level of substantially said substantially constant supply voltage.

38. The integrated circuit device of claim 34 wherein said first and additional power-gating transistors comprise high voltage P-channel devices.

39. The integrated circuit device of claim 34 wherein said second and another power-gating transistors comprise high voltage N-channel devices.

40. The integrated circuit device of claim 34 wherein said first and additional power-gating transistors comprise high voltage N-channel devices.

41. The integrated circuit device of claim 34 wherein said another power-gating transistor is turned on in a Sleep Mode.

42. The integrated circuit device of claim 34 wherein said another power-gating transistor is turned off in an Active Mode.

43. The integrated circuit device of claim 33 wherein said additional power-gating transistor is turned on in a Sleep Mode.

44. The integrated circuit device of claim 33 wherein said additional power-gating transistor is turned off in an Active Mode.

45. The integrated circuit device of claim 29 wherein said first and second power-gating transistor are turned off in a Sleep Mode.

46. The integrated circuit device of claim 29 wherein said first and second power-gating transistor are turned on in an Active Mode.

47. An integrated circuit device including a source of a substantially constant supply voltage and a substantially constant reference voltage, said device comprising:
a power-gating transistor coupling said source of said substantially constant supply voltage to a first switched voltage line;
a second switched voltage line having a Sleep Mode voltage below that of said substantially constant reference voltage;
at least one stage coupled between said first switched voltage line and said second switched voltage line; and
an output stage coupled to the output of said at least one stage and coupled between said source of said substantially constant supply voltage and said substantially constant reference voltage.

48. The integrated circuit device of claim 47 wherein said power-gating transistor comprises a P-channel transistor having a gate terminal thereof for receiving a Sleep Mode voltage above that of said substantially constant supply voltage.

49. The integrated circuit device of claim 47 wherein said second switched voltage line has an Active Mode voltage substantially equal to said substantially constant reference voltage.

50. The integrated circuit device of claim 48 wherein said gate terminal of said P-channel transistor receives an Active Mode voltage below that of said substantially constant reference voltage.

51. The integrated circuit device of claim 47 further comprising at least one additional stage coupled between said source of said substantially constant supply voltage and said substantially constant reference voltage for driving said at least one stage.

52. An integrated circuit device including a source of a substantially constant supply voltage and a substantially constant reference voltage, said device comprising:
a power-gating transistor coupling said substantially constant reference voltage to a first switched voltage line;
a second switched voltage line having a Sleep Mode voltage above that of said substantially constant supply voltage;
at least one stage coupled between said first switched voltage line and said second switched voltage line; and
an output stage coupled to the output of said at least one stage and coupled between said source of said substantially constant supply voltage and said substantially constant reference voltage.

53. The integrated circuit device of claim 52 wherein said power-gating transistor comprises an N-channel transistor having a gate terminal thereof for receiving a Sleep Mode voltage below that of said substantially constant reference voltage.

54. The integrated circuit device of claim 53 wherein said second switched voltage line has an Active Mode voltage substantially equal to said substantially constant supply voltage.

55. The integrated circuit device of claim 53 wherein said gate terminal of said N-channel transistor receives an Active Mode voltage above that of said substantially constant supply voltage.

56. The integrated circuit device of claim 52 further comprising at least one additional stage coupled between said source of said substantially constant supply voltage and said substantially constant reference voltage for driving said at least one stage.

* * * * *